United States Patent
Chuang (10) Patent No.: US 11,126,211 B1
(45) Date of Patent: Sep. 21, 2021

(54) CHIP PACKAGE ASSEMBLY AND CHIP FUNCTION EXECUTION METHOD THEREOF

(71) Applicant: REALTEK SEMICONDUCTOR CORP., Hsinchu (TW)

(72) Inventor: Tsung-Peng Chuang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/138,204

(22) Filed: Dec. 30, 2020

(30) Foreign Application Priority Data

Sep. 18, 2020 (TW) .................................. 109132476

(51) Int. Cl.
| | |
|---|---|
| *H03K 5/153* | (2006.01) |
| *G05F 1/46* | (2006.01) |
| *H03K 5/24* | (2006.01) |
| *G06F 3/16* | (2006.01) |
| *H04R 3/00* | (2006.01) |
| *H03G 3/30* | (2006.01) |

(52) U.S. Cl.
CPC ................. *G05F 1/46* (2013.01); *H03K 5/24* (2013.01); *G06F 3/165* (2013.01); *H03G 3/30* (2013.01); *H04R 3/00* (2013.01); *H04R 2430/01* (2013.01)

(58) Field of Classification Search
CPC ...... H03K 17/223; H03K 17/22; H03K 5/135; H03K 5/2481; H03K 5/249; H03K 5/08; H03K 5/24; G06F 1/24; G06F 1/30; G01R 19/16519
USPC .............................. 327/77, 142, 143, 198, 74
See application file for complete search history.

(56) References Cited

U.S. PATENT DOCUMENTS

| | | | | | |
|---|---|---|---|---|---|
| 5,943,272 | A | * | 8/1999 | Chang | G11C 11/5642 365/189.09 |
| 6,075,390 | A | * | 6/2000 | Shin | H03M 11/24 327/403 |
| 7,446,574 | B2 | * | 11/2008 | Ohira | G01R 19/16542 327/206 |
| 8,436,664 | B2 | * | 5/2013 | Wang | G06F 1/28 327/142 |
| 8,836,386 | B1 | * | 9/2014 | Hwang | H03K 17/22 327/143 |
| 9,007,097 | B2 | * | 4/2015 | Chen | H03K 5/1254 327/77 |
| 10,285,081 | B1 | * | 5/2019 | Bartels | H02J 7/0047 |
| 10,536,138 | B1 | * | 1/2020 | Huang | H03K 5/15073 |
| 2007/0126473 | A1 | * | 6/2007 | Awalt | H03K 19/1732 326/33 |

(Continued)

*Primary Examiner* — Quan Tra
(74) *Attorney, Agent, or Firm* — Birch, Stewart, Kolasch & Birch, LLP (57) ABSTRACT

A chip package assembly and a chip function execution method thereof are provided. The chip package assembly includes a plurality of pins, and one of the plurality of pins is configured to receive a voltage signal. A processing circuit is configured to receive the voltage signal, where the processing circuit determines whether a voltage level of the voltage signal is a first level or a second level, to generate a first control signal according to the first level, and generate a second control signal according to the second level. A first functional circuit of a plurality of functional circuits executes a first function according to the first control signal, and a second functional circuit of the plurality of functional circuits executes a second function according to the second control signal.

8 Claims, 7 Drawing Sheets

(56) References Cited

U.S. PATENT DOCUMENTS

2008/0080281 A1* 4/2008 Seo .................. G11C 5/14
                                              365/205
2018/0069470 A1* 3/2018 Chang ............... H02M 3/04

* cited by examiner

CHIP PACKAGE ASSEMBLY AND CHIP FUNCTION EXECUTION METHOD THEREOF

CROSS-REFERENCE TO RELATED APPLICATION

This non-provisional application claims priority under 35 U.S.C. § 119(a) to Patent Application No. 109132476 filed in Taiwan, R.O.C. on Sep. 18, 2020, the entire contents of which are hereby incorporated by reference.

BACKGROUND

Technical Field

The present disclosure relates to a chip package assembly and a chip function execution method thereof.

Related Art

As a manufacturing process technology is increasingly advanced, to match a current mainstream small-size electronic product, a size of a chip is also increasingly small, but people have an increasingly high functional requirement for electronic devices. Because each function of the chip needs an output/input signal of a pin to implement the function corresponding to the pin, a quantity of pins of the chip is particularly important, and more pins can support more functions.

For a currently common wafer level chip scale package (WLCSP) or quad flat no-lead (QFN) package, the chip needs to execute a large quantity of specific functions, and therefore a quantity of required pins corresponding to the functions is also huge. If the size of the chip is reduced by reducing the quantity of pins to match the small-size electronic device, a choice needs to be made among the functions to be executed, and consequently some functions cannot be executed. If all the functions are retained, a lot of costs need to be consumed in the manufacturing process, and the chip cannot be applied to the small-size electronic device. Therefore, it is an important task to find a win-win method nowadays.

SUMMARY

In some embodiments, a chip package assembly includes a plurality of pins, and one of the plurality of pins is configured to receive a voltage signal. A processing circuit is configured to receive the voltage signal, where the processing circuit determines whether a voltage level of the voltage signal is a first level or a second level, to generate a first control signal according to the first level, and generate a second control signal according to the second level. A first functional circuit of a plurality of functional circuits executes a first function according to the first control signal, and a second functional circuit of the plurality of functional circuits executes a second function according to the second control signal.

Based on the foregoing, according to the embodiments of the chip package assembly and the chip function execution method thereof according to the present disclosure, the chip package assembly receives a voltage signal by using a pin within a given time after being powered on, and executes a first function or a second function according to a voltage level of the voltage signal. In addition, the chip package assembly receives a voltage signal by using the same pin after the given time after being powered on, and executes a third function or a fourth function according to a voltage level of the voltage signal. Therefore, through a technology of determining a voltage level to switch functions and performing time-division multiplexing, the chip package assembly does not require that one pin corresponds to only one function, and the chip package assembly can support at least four functions according to one pin. The chip package assembly has a reduced quantity of pins in a case that the functions are kept unchanged, to achieve multifunctionality and save manufacturing process costs due to the reduction in a chip package size.

DETAILED DESCRIPTION

Figure 1:
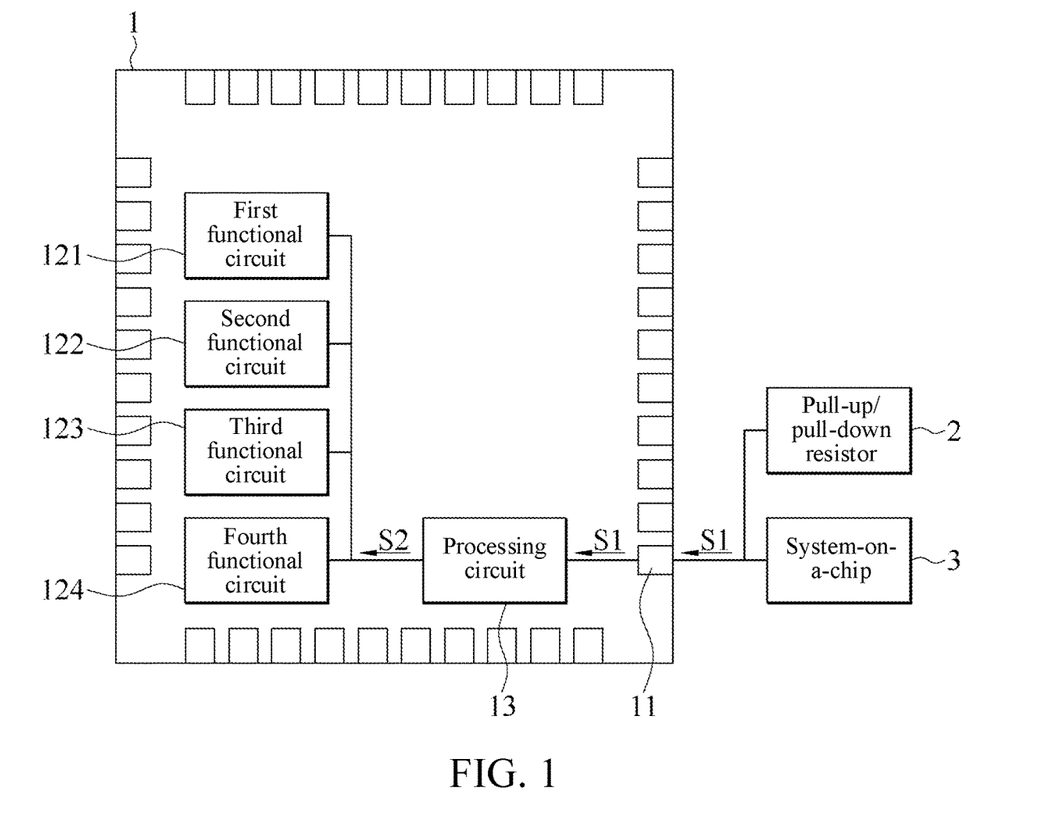
FIG. 1 is a schematic diagram of an embodiment of a chip package assembly according to the present disclosure.

Referring to FIG. 1, FIG. 1 is a schematic diagram of an embodiment of a chip package assembly 1 according to the present disclosure. The chip package assembly 1 includes a plurality of pins, a plurality of functional circuits, and a processing circuit 13. The plurality of pins are disposed around side edges of the chip package assembly 1, the plurality of pins are separately coupled to the processing circuit 13, and the processing circuit 13 is coupled to the plurality of functional circuits. That is, the processing circuit 13 is coupled between the plurality of pins and the plurality of functional circuits. FIG. 1 shows 40 pins and a labeled pin 11 is used as an example. In addition, in FIG. 1, four functional circuits 121 to 124 (for ease of description, referred to as a first functional circuit 121, a second functional circuit 122, a third functional circuit 123, and a fourth functional circuit 124 below) of the plurality of functional circuits are used as an example. The processing circuit 13 is coupled to the pin 11, and the first functional circuit 121, the second functional circuit 122, the third functional circuit 123, and the fourth functional circuit 124 are separately coupled to the processing circuit 13. That is, the processing circuit 13 is coupled between the pin 11 and the first functional circuit 121, the second functional circuit 122, the third functional circuit 123 as well as the fourth functional circuit 124.

Figure 3:
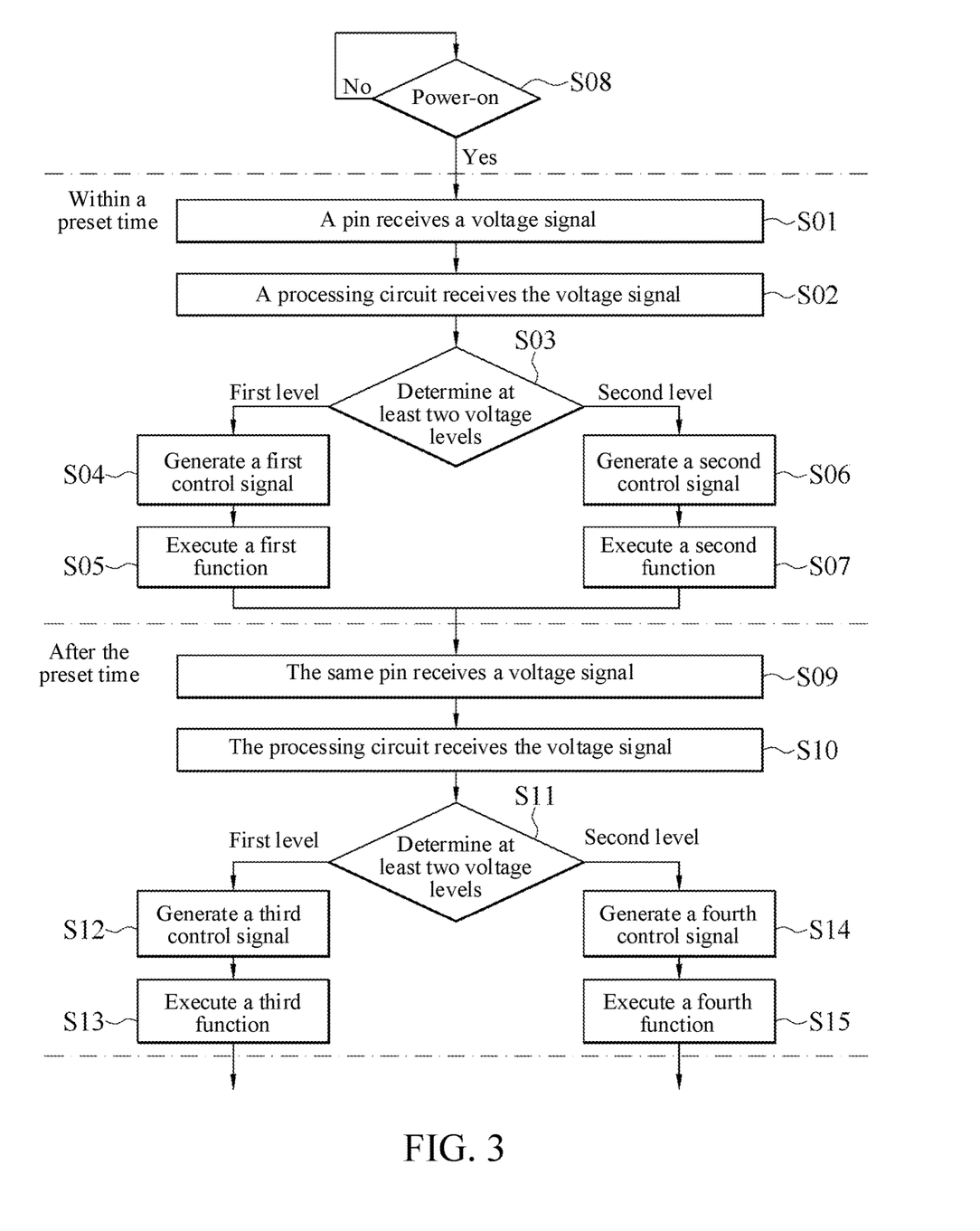
FIG. 3 is a flowchart of an embodiment of a chip function execution method according to the present disclosure.

For brevity of description, the pin 11 is used as an example for the description below. Referring to FIG. 3 together, FIG. 3 is a flowchart of an embodiment of a chip function execution method according to the present disclosure. The chip package assembly 1 receives a voltage signal S1 from the outside by using the pin 11 (step S01), and transmits the voltage signal S1 to the processing circuit 13 by using the pin 11, and the processing circuit 13 receives the voltage signal S1 (step S02). The voltage signal S1 has a voltage level, and the processing circuit 13 determines whether the voltage level of the voltage signal S1 is a first level or a second level after receiving the voltage signal S1 (step S03).

When the processing circuit 13 determines that the voltage level of the voltage signal S1 is the first level, the processing circuit 13 generates a control signal S2 as a first control signal according to the first level (step S04). The processing circuit 13 transmits the control signal S2 as the first control signal to the first functional circuit 121 of the plurality of functional circuits, and after the first functional circuit 121 receives the control signal S2 as the first control signal, the first functional circuit 121 executes a first function according to the first control signal (step S05). Otherwise, when the processing circuit 13 determines that the voltage level of the voltage signal S1 is the second level, the processing circuit 13 generates a control signal S2 as a second control signal according to the second level (step S06). The processing circuit 13 transmits the control signal S2 as the second control signal to the second functional circuit 122 of the plurality of functional circuits, and after the second functional circuit 122 receives the control signal S2 as the second control signal, the second functional circuit 122 executes a second function according to the second control signal (step S07). The second function is different from the first function.

Based on this, the pin 11 receives the voltage signal S1, and the processing circuit 13 switches between the first functional circuit 121 and the second functional circuit 122 according to the voltage level of the voltage signal S1, to execute different functions, that is, the first functional circuit 121 executes the first function or the second functional circuit 122 executes the second function. Therefore, one pin of the chip package assembly 1 corresponds to more than one function, and the chip package assembly 1 may support a plurality of different functions according to one pin. The chip package assembly 1 has a reduced quantity of pins in a case that the functions are kept unchanged, to achieve multifunctionality and save manufacturing process costs due to the reduction in a chip package size.

In some embodiments, as shown in FIG. 3, the chip package assembly 1 may perform steps S01 to S07 within a given time after being powered on (a determining result in step S08 is "Yes"). That is, the pin 11 may receive the voltage signal S1 within the given time after being powered on and transmit the voltage signal S1 to the processing circuit 13, and the processing circuit 13 may determine whether the voltage level of the voltage signal S1 is the first level or the second level within the given time, to generate the control signal S2 as the first control signal or the second control signal, so that the first functional circuit 121 executes the first function according to the first control signal within the given time, or the second functional circuit 122 executes the second function according to the second control signal within the given time. The given time is adjustable.

Figure 2:
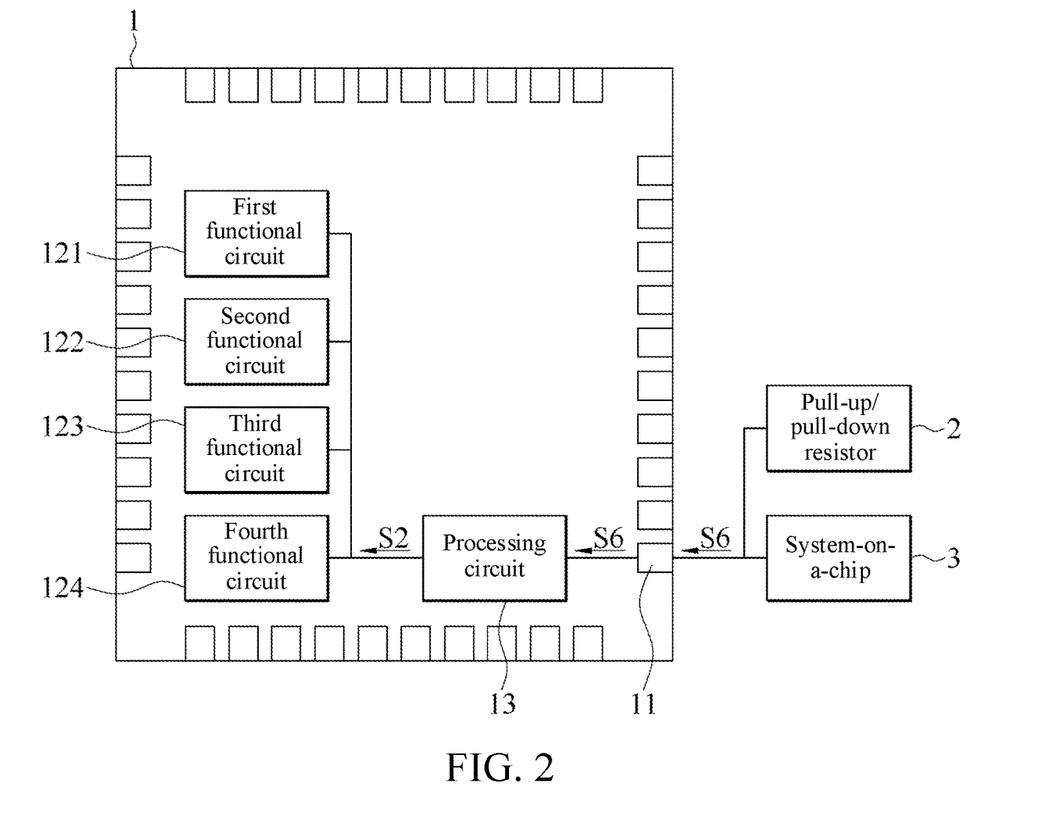
FIG. 2 is a schematic diagram of another embodiment of the chip package assembly in FIG. 1.

Then, referring to FIG. 2 together, the pin 11 that performs step S01 may receive a voltage signal S6 from the outside after the given time after being powered on (step S09), the pin 11 transmits the voltage signal S6 to the processing circuit 13, and the processing circuit 13 receives the voltage signal S6 after the given time (step S10). After the processing circuit 13 receives the voltage signal S6, the processing circuit 13 determines whether a voltage level of the voltage signal S6 is the first level or the second level after the given time (step S11).

When the processing circuit 13 determines that the voltage level of the voltage signal S6 is the first level, the processing circuit 13 generates a control signal S2 as a third control signal according to the first level (step S12), and the third control signal is different from the first control signal. The processing circuit 13 transmits the control signal S2 as the third control signal to the third functional circuit 123 of the plurality of functional circuits, and after the third functional circuit 123 receives the control signal S2 as the third control signal, the third functional circuit 123 executes a third function according to the third control signal (step S13). Otherwise, when the processing circuit 13 determines that the voltage level of the voltage signal S6 is the second level, the processing circuit 13 generates a control signal S2 according to the second level, and the control signal S2 is a fourth control signal different from the second control signal (step S14). The processing circuit 13 transmits the control signal S2 as the fourth control signal to the fourth functional circuit 124 of the plurality of functional circuits, and after the fourth functional circuit 124 receives the control signal S2 as the fourth control signal, the fourth functional circuit 124 executes a fourth function according to the fourth control signal (step S15).

The fourth function is different from the third function, and the processing circuit 13 performs steps S01 to S07 within the given time or performs steps S09 to S15 after the given time. The third function is different from the first function, and the fourth function is different from the second function. For example, as described above, when the first function and the second function within the corresponding given time may be functions of controlling volume increase and decrease respectively, and the third function and the fourth function after the corresponding given time may be functions of performing control to disable muting of a sound effect and performing control to enable muting of the sound effect respectively. Based on this, the given time after being powered-on is divided into two time intervals, and only the pin 11 is required to receive the voltage signals S1 and S6. The chip package assembly 1 may perform steps S01 to S07 within the given time, and perform steps S09 to S15 after the given time. That is, the chip package assembly 1 may execute the first function, the second function, or both the first function and the second function within the given time, and the chip package assembly 1 may execute the third function, the fourth function, or both the third function and the fourth function after the given time. The pin 11 separately receives the voltage signals S1 and S6 at different time intervals, and the chip package assembly 1 may execute four different functions at different time intervals.

In some embodiments, in step S03 and step S11, the processing circuit 13 may adjust a quantity of determination levels according to a quantity of the plurality of functional circuits, and the processing circuit 13 may determine at least two voltage levels. In other words, the processing circuit 13 may determine whether voltage levels of the voltage signals S1 and S6 are the first level, the second level, or another level different from the foregoing levels, and when the processing circuit 13 determines that the voltage levels are the another level, another control signal different from the first control signal and the second control signal or another control signal different from the third control signal and the fourth control signal may be generated. The first functional circuit 121 executes another function different from the first function and the second function, or executes another function different from the third function and the fourth function according to the another control signal.

In some embodiments, a pull-up/pull-down resistor 2 and a system-on-a chip 3 are separately coupled to the plurality of pins of the chip package assembly 1 outside the chip package assembly 1. That is, the plurality of pins are coupled between the processing circuit 13 and the pull-up/pull-down resistor 2 as well as the system-on-a chip 3. An example in which the pull-up/pull-down resistor 2 and the system-on-a chip 3 are separately coupled to the pin 11 is used in FIG. 1 and FIG. 2. When the chip package assembly 1 is within the given time after being powered on, the pull-up/pull-down resistor 2 transmits the voltage signal S1 to the pin 11 of the chip package assembly 1, the voltage signal S1 in step S01 within the given time is from the pull-up/pull-down resistor 2, and the chip package assembly 1 performs steps S02 to S07 according to the voltage signal S1 that is transmitted by the pull-up/pull-down resistor 2 and that is received by the pin 11. When the chip package assembly 1 is after the given time after being powered on, the system-on-a chip 3 transmits the voltage signal S6 to the pin 11 of the chip package assembly 1, the voltage signal S6 in step S09 within the given time is from the system-on-a chip 3, and the chip package assembly 1 performs steps S10 to S15 according to the voltage signal S6 that is transmitted by the system-on-a chip 3 and that is received by the pin 11.

In some embodiments, the given time may be a time before the chip package assembly 1 enters an operating system (OS) after being powered on. For example, the first functional circuit 121 is configured to execute the first function of increasing system volume, the second functional circuit 122 is configured to execute the second function of decreasing the system volume, the third functional circuit 123 is configured to execute the third function of disabling muting of a system sound effect, and the fourth functional circuit 124 is configured to execute the fourth function of enabling muting of the system sound effect. Before entering the OS, the pin 11 of the chip package assembly 1 receives the voltage signal S1 transmitted from the pull-up/pull-down resistor 2 in step S01, and when the processing circuit 13 determines that the voltage level of the voltage signal S1 is the first level, that is, in steps S04 and S05, the processing circuit 13 generates the first control signal, and the first functional circuit 121 that is configured to control the system volume to increase receives the first control signal, and executes, according to the first control signal, the first function of increasing the system volume. Therefore, the chip package assembly 1 has completed a setting of increasing the system volume before entering the OS.

Moreover, after entering the OS, the system of the chip package assembly 1 receives the voltage signal S6 transmitted from the system-on-a chip 3 in step S09, and when the processing circuit 13 determines that the voltage level of the voltage signal S6 is the second level, that is, in steps S06 and S07, the processing circuit 13 generates the fourth control signal, and the fourth functional circuit 124 that is configured to perform control to enable muting of the system sound effect receives the fourth control signal, and executes, according to the fourth control signal, the fourth function of enabling muting of the system sound effect. Therefore, the chip package assembly 1 switches the previous setting of increasing the volume to a setting of enabling muting of the system sound effect after entering the OS. In some embodiments, the given time may be 1 millisecond (ms).

In some embodiments, the processing circuit 13 includes a plurality of comparators and a processor 134. Referring to circuit diagrams of three embodiments in FIG. 4, FIG. 5, and FIG. 6, a pin 11 is coupled between a processing circuit 13 and a system-on-a chip 3. The system-on-a chip 3 includes a voltage source VDD and a plurality of transistors connected in parallel, and the processing circuit 13 includes the plurality of comparators connected in parallel and the processor 134. In addition, FIG. 4, FIG. 5, and FIG. 6 are different from each other in that the processing circuit 13 of FIG. 4 further includes a variable resistor coupled between the pin 11 and the plurality of comparators, while the system-on-a chip 3 of FIG. 6 further includes a resistor coupled between the plurality of transistors and the pin 11.

Figure 4:
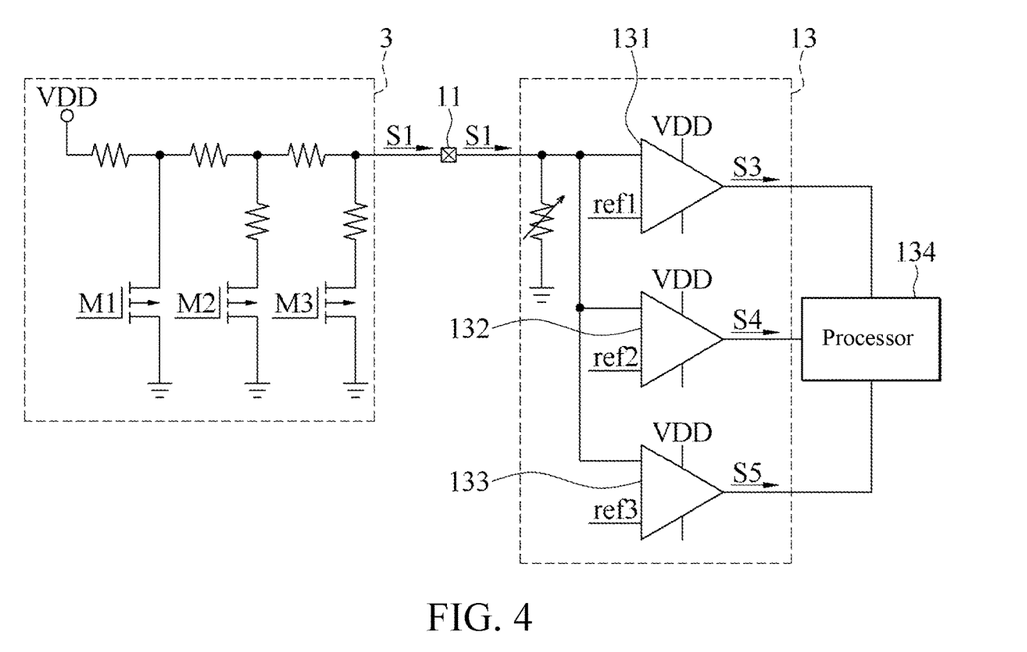
FIG. 4 is a circuit diagram of an embodiment of a pin, a processing circuit, and a system-on-a chip of the chip package assembly in FIG. 1.
Figure 5:
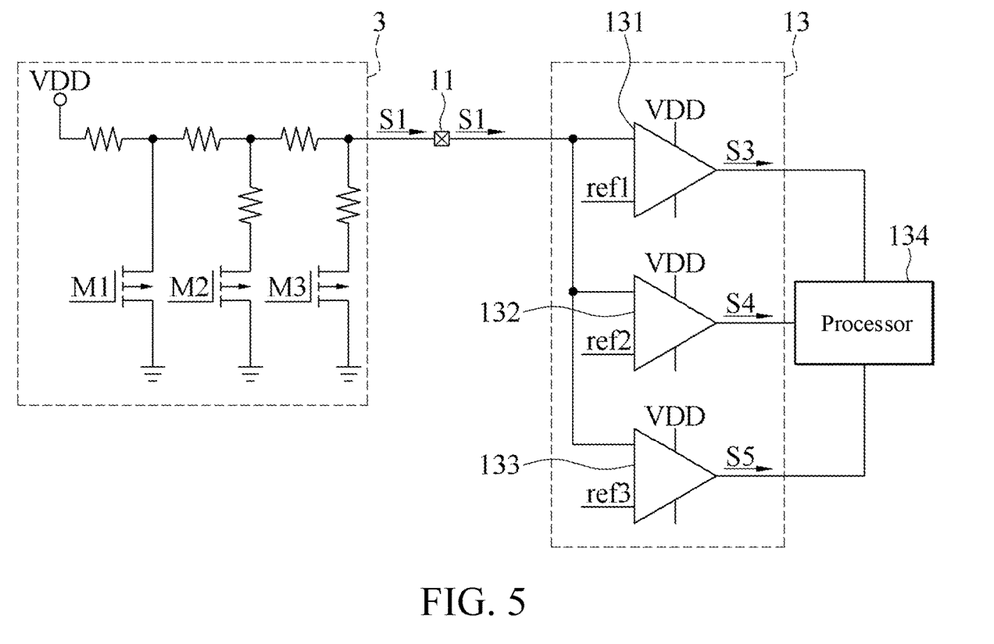
FIG. 5 is a circuit diagram of another embodiment of a pin, a processing circuit, and a system-on-a chip of the chip package assembly in FIG. 1.
Figure 6:
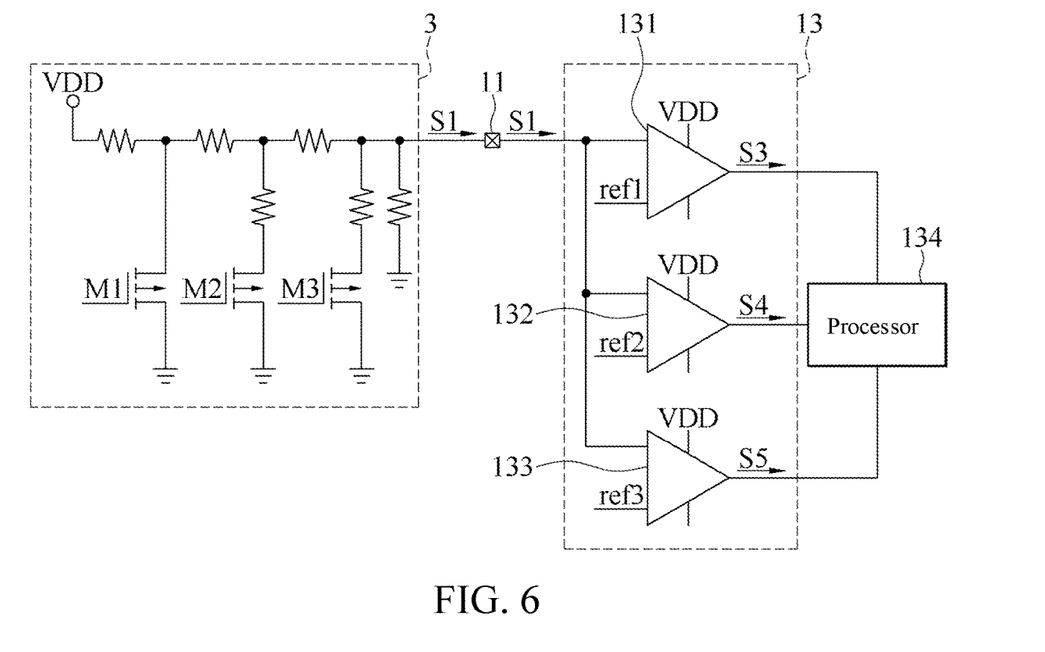
FIG. 6 is a circuit diagram of another embodiment of a pin, a processing circuit, and a system-on-a chip of the chip package assembly in FIG. 1.

In FIG. 4, FIG. 5, and FIG. 6, three transistors M1, M2, and M3, three comparators 131, 132, and 133, and a voltage signal S1 are used as an example. The transistors M1, M2, and M3 are coupled between the voltage source VDD and the pin 11, and the comparators 131, 132, and 133 are coupled between the pin 11 and the processor 134. Specifically, the transistors M1, M2, and M3 may be used as on-off switches, and the system-on-a chip 3 may combine a plurality of different voltage levels according to the voltage source VDD and respective operating states (on and off) of the plurality of transistors, to generate the voltage signal S1 with the voltage level.

Moreover, the comparators 131, 132, and 133 in the processing circuit 13 may receive given levels ref1, ref2, and ref3 respectively, where the given levels ref1, ref2, and ref3 are adjustable. In step S11, the comparator 131 compares the voltage level of the voltage signal S1 with the given level ref1, where when the voltage level is greater than the given level ref1, a comparison result S3 is outputted to the processor 134, and when the voltage level is less than the given level ref1, no output is performed; the comparator 132 compares the voltage level of the voltage signal S1 with the given level ref2, where when the voltage level is greater than the given level ref2, a comparison result S4 is outputted to the processor 134, and when the voltage level is less than the given level ref2, no output is performed; and the comparator 133 compares the voltage level of the voltage signal S1 with the given level ref3, where when the voltage level is greater than the given level ref3, a comparison result S5 is outputted to the processor 134, and when the voltage level is less than the given level ref3, no output is performed. Therefore, the processor 134 may determine whether the voltage level of the voltage signal S1 is the first level, the second level, or another level according to the comparison results S3, S4, and S5. When the determining result is the first level, the processor 134 performs step S12. When the determining result is the second level, the processor 134 performs step S14.

For example, the given level ref1 may be 1 volt (V), the given level ref2 may be 2 V, the given level ref3 may be 3 V, and each of the comparison results S3, S4, and S5 may be 1. When receiving the comparison result S3, the processor 134 determines that the voltage level is the first level. When receiving the comparison result S4, the processor 134 determines that the voltage level is the second level. When receiving the comparison result S5, the processor 134 determines that the voltage level is another level. When the system-on-a chip 3 generates a voltage signal S1 with a voltage level of 2.5 V according to the voltage source VDD and the respective on or off of the transistors M1, M2, and M3, the system-on-a chip 3 transmits the voltage signal S1 with the voltage level of 2.5 V to the processing circuit 13 by using the pin 11. If determining that the voltage level of 2.5 V is greater than the given level ref1 of 1 V, the comparator 131 outputs a comparison result S3 of "1" to the processor 134; moreover, if determining that the voltage level of 2.5 V is greater than the given level ref2 of 2 V, the comparator 132 outputs a comparison result S4 of "1" to the processor 134; in addition, if determining that the voltage level of 2.5 V of the voltage signal S1 is less than the given level ref3 of 3 V, the comparator 133 does not output a comparison result S5 to the processor 134, and the processor 134 may determine that the voltage level of the voltage signal S1 is the second level according to the received comparison result S4 of 1.

Figure 7:
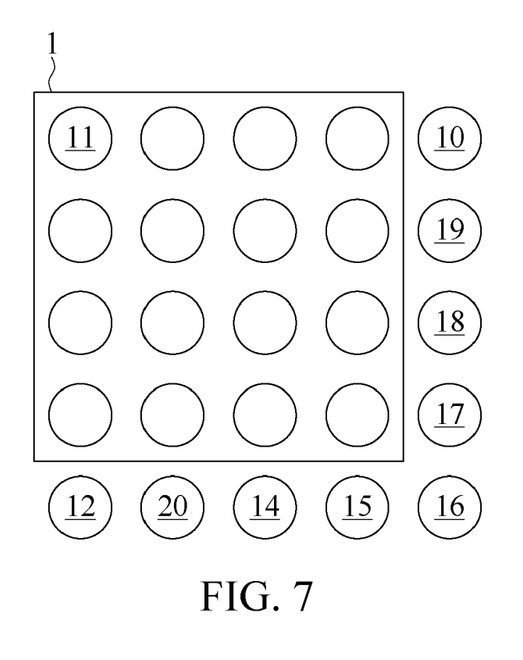
FIG. 7 is a schematic diagram of another embodiment of the chip package assembly according to the present disclosure.

In some embodiments, as shown in FIG. 1, the chip package assembly 1 may be a quad flat no-lead (QFN) package. In addition, referring to FIG. 7, the chip package assembly 1 may be alternatively another package type, that is, a wafer level chip scale package (WLCSP). The quantity of pins required may be reduced according to an embodiment of the present disclosure regardless of what package type is used for the chip package assembly 1. For example, in FIG. 7, when the chip package assembly 1 is provided with 25 pins including the pin 11 and pins 12 to 19, and 10, the setting of the chip package assembly 1 needs to use a manufacturing process of 180 nm. When the chip package assembly 1 needs to reduce the manufacturing process to 110 nm to reduce the costs but needs to retain all original functions at the same time, the chip package assembly 1 enables one pin to support a plurality of functions according to an embodiment of the present disclosure. In this case, the quantity of pins may be reduced in a case that the functions are kept unchanged, for example, only 20 pins are required. That is, the pins 12, 14 to 19, 10, and 20 may be removed from the chip package assembly 1, to save the manufacturing process costs of the chip package assembly 1.

Based on the foregoing, according to the embodiments of the chip package assembly and the chip function execution method thereof according to the present disclosure, the chip package assembly receives a voltage signal by using a pin within a given time after being powered on, and executes a first function or a second function according to a voltage level of the voltage signal. In addition, the chip package assembly receives a voltage signal by using the same pin after the given time after being powered on, and executes a third function or a fourth function according to a voltage level of the voltage signal. Therefore, through a technology of determining a voltage level to switch functions and performing time-division multiplexing, the chip package assembly does not require that one pin corresponds to only one function, and the chip package assembly can support at least four functions according to one pin. The chip package assembly has a reduced quantity of pins in a case that the functions are kept unchanged, to achieve multifunctionality and save manufacturing process costs due to the reduction in a chip package size.

Although the present disclosure has been described in considerable detail with reference to certain preferred embodiments thereof, the disclosure is not for limiting the scope of the disclosure. Persons having ordinary skill in the art may make various modifications and changes without departing from the scope and spirit of the disclosure. Therefore, the scope of the appended claims should not be limited to the description of the preferred embodiments described above.

What is claimed is:

1. A chip package assembly, comprising:
   a plurality of pins, wherein one of the pins is configured to receive a voltage signal;
   a processing circuit, coupled between the pins and functional circuits, and configured to receive the voltage signal, wherein the processing circuit determines whether a voltage level of the voltage signal is a first level or a second level, to generate a first control signal according to the first level, and generate a second control signal according to the second level; and
   a plurality of functional circuits, wherein a first functional circuit of the functional circuits executes a first function according to the first control signal, and a second functional circuit of the functional circuits executes a second function according to the second control signal,
   wherein the processing circuit generates the first control signal if determining that the voltage level is the first level within a given time after being powered on, and the processing circuit generates a third control signal if determining that the voltage level is the first level after the given time, to control a third functional circuit of the functional circuits to execute a third function according to the third control signal, wherein the given time is a time before the chip package assembly enters an operating system after being powered on.

2. The chip package assembly according to claim 1, wherein the processing circuit generates the second control signal when determining that the voltage level is the second level within the given time, and the processing circuit generates a fourth control signal when determining that the voltage level is the second level after the given time, to control a fourth functional circuit of the functional circuits to execute a fourth function according to the fourth control signal.

3. The chip package assembly according to claim 1, wherein the voltage signal is from a pull-up/pull-down resistor within the given time, and the voltage signal is from a system-on-a chip after the given time.

4. The chip package assembly according to claim 1, wherein the processing circuit comprises a comparator and a processor, wherein the comparator compares the voltage level with a given level to generate a comparison result, and the processor determines whether the voltage level is the first level or the second level according to the comparison result.

5. A chip function execution method applicable to a chip package assembly, the method comprising:
   receiving, by a pin of the chip package assembly, a voltage signal;
   determining, by a processing circuit of the chip package assembly, whether a voltage level of the voltage signal is a first level or a second level;
   generating, by the processing circuit, a first control signal according to the first level when the voltage level is the first level;
   generating, by the processing circuit, a second control signal according to the second level when the voltage level is the second level;
   executing, by a first functional circuit of the chip package assembly, a first function according to the first control signal; and
   executing, by a second functional circuit of the chip package assembly, a second function according to the second control signal,
   wherein in the step of determining the voltage level of the voltage signal, the processing circuit determines that the voltage level is the first level within a given time after being powered on, and the chip function execution method further comprises:
   receiving, by the pin of the chip package assembly, another voltage signal after the given time;

determining, by the processing circuit, whether a voltage level of the another voltage signal is the first level or the second level;

generating, by the processing circuit, a third control signal according to the first level when the voltage level of the another voltage signal is the first level; and executing, by a third functional circuit of the chip package assembly, a third function according to the third control signal, wherein the given time is a time before the chip package assembly enters an operating system after being powered on.

6. The chip function execution method according to claim 5, wherein in the step of determining the voltage level of the voltage signal, the processing circuit determines that the voltage level is the second level within the given time after being powered on, and the chip function execution method further comprises:

generating, by the processing circuit, a fourth control signal according to the second level when processing circuit determines that the voltage level of the another voltage signal is the second level after the given time; and executing, by a fourth functional circuit of the chip package assembly, a fourth function according to the fourth control signal.

7. The chip function execution method according to claim 5, wherein the voltage signal is from a pull-up/pull-down resistor within the given time, and the another voltage signal is from a system-on-a chip after the given time.

8. The chip function execution method according to claim 5, wherein in the step of determining the voltage level of the voltage signal, a comparator of the processing circuit compares the voltage level with a given level to generate a comparison result, and a processor of the processing circuit determines whether the voltage level is the first level or the second level according to the comparison result.

* * * * *